(12) United States Patent
Davis

(10) Patent No.: US 9,991,250 B2
(45) Date of Patent: Jun. 5, 2018

(54) ELECTROSTATIC DISCHARGE DEVICES AND METHOD OF MAKING THE SAME

(71) Applicant: Semiconductor Components Industries, LLC, Phoenix, AZ (US)

(72) Inventor: T. Jordan Davis, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days. days.

(21) Appl. No.: 15/197,889

(22) Filed: Jun. 30, 2016

(65) Prior Publication Data

US 2017/0012035 A1 Jan. 12, 2017

Related U.S. Application Data

(60) Provisional application No. 62/189,104, filed on Jul. 6, 2015, provisional application No. 62/218,829, filed on Sep. 15, 2015.

(51) Int. Cl.
*H01L 27/02* (2006.01)
*H01L 29/866* (2006.01)

(52) U.S. Cl.
CPC ...... *H01L 27/0248* (2013.01); *H01L 27/0255* (2013.01); *H01L 27/0259* (2013.01); *H01L 27/0292* (2013.01); *H01L 29/866* (2013.01)

(58) Field of Classification Search
CPC ..... H01L 23/60; H01L 23/62; H01L 27/0255; H01L 27/0259; H01L 27/0248; H01L 27/0292
See application file for complete search history.

(56) References Cited

U.S. PATENT DOCUMENTS

| | | | |
|---|---|---|---|
| 7,538,395 B2 | 5/2009 | Keena et al. | |
| 9,224,703 B2 | 12/2015 | Davis | |
| 2009/0079022 A1* | 3/2009 | Keena | H01L 27/0255 257/494 |
| 2012/0007207 A1* | 1/2012 | Salcedo | H01L 27/0259 257/491 |
| 2015/0084162 A1 | 3/2015 | Davis | |

* cited by examiner

*Primary Examiner* — Fei Fei Yeung Lopez
(74) *Attorney, Agent, or Firm* — Noon Intellectual Property Law, P.C.

(57) ABSTRACT

In one embodiment, electrostatic discharge (ESD) devices are disclosed.

19 Claims, 3 Drawing Sheets ical Discharge Devices
ELECTROSTATIC DISCHARGE DEVICES AND METHOD OF MAKING THE SAME

CROSS-REFERENCE TO RELATED APPLICATIONS

This application claims the benefit of priority to U.S. Application No. 62/189,104, filed Jul. 6, 2015, and U.S. Application No. 62/218,829, filed Sep. 15, 2015, both of which are hereby incorporated by reference in their entirety.

BACKGROUND

The semiconductor industry has utilized various methods and structures to form electrostatic discharge (ESD) protection devices. According to one international specification, the International Electrotechnical Commission (IEC) specification commonly referred to as IEC 61000-4-2 (level 2), it is desirable for an ESD device to respond to a high input voltage and current within approximately 1 nanosecond (the IEC has an address at 3, rue de Varembe, 1211 Geneve 20, Switzerland).

Some of the prior ESD devices used a zener diode in combination with a P-N junction diode. In most cases, the device structures had a high capacitance, generally greater than about one to six (1-6 pico-farads). The high capacitance limited the response time of the ESD device and also was a load to the device that was connected to the ESD device. Some prior ESD devices operated in a punch-through mode which required the devices to have a very thin and accurately controlled epitaxial layer, generally less than about 2 microns, and required a low doping in the epitaxial layer. These structures generally made it difficult to accurately control the clamping voltage of the ESD device and especially difficult to control low clamping voltages, such as voltages of less than about ten volts (10 V).

Accordingly, it may be desirable to have an electrostatic discharge (ESD) device that has a low capacitance, that has a fast response time, that reacts to both a positive and a negative ESD event, that has a well-controlled clamp voltage, that is easy to control in manufacturing, and that has a clamp voltage that can be controlled to over a range of voltages from a low voltage to a high voltage.

BRIEF DESCRIPTION OF THE DRAWINGS

Embodiments of present invention will become more fully understood from the detailed description and the accompanying drawings, which are not intended to limit the scope of the present application.

Figure 1:
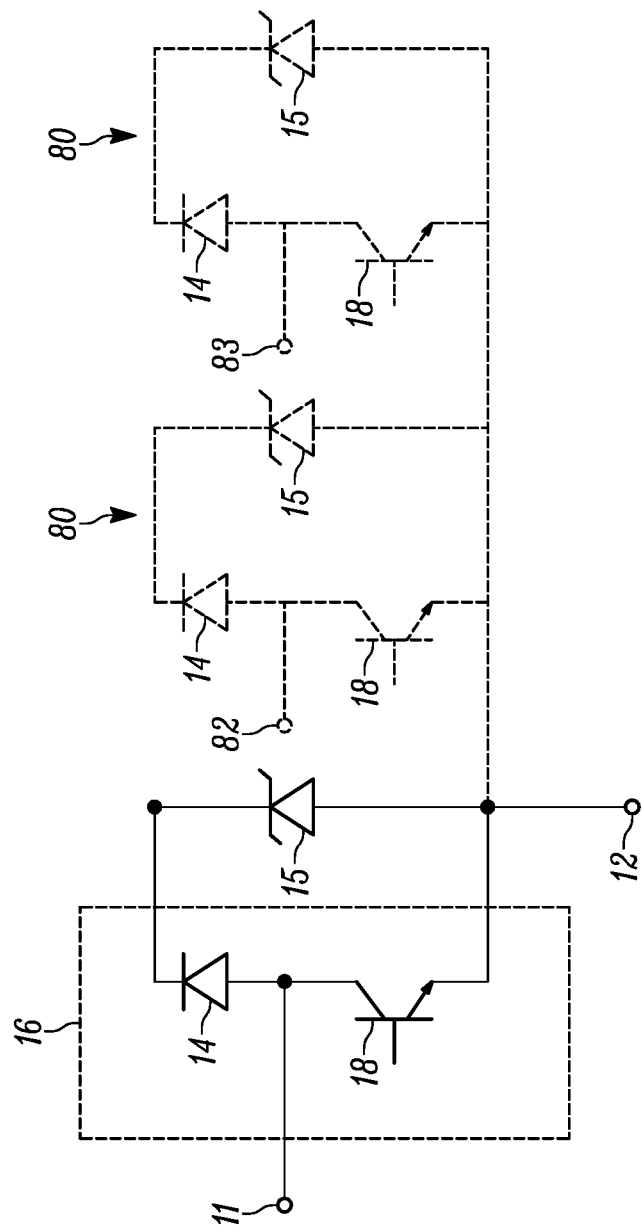
FIG. 1 includes a schematic diagram of a circuit for an ESD device in accordance with some embodiments of the present application.

For simplicity and clarity of the illustration, elements in the figures are not necessarily to scale, are only schematic and are non-limiting, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible. It will be appreciated by those skilled in the art that the words "during", "while", and "when" as used herein relating to circuit operation are not exact terms that mean an action takes place instantly upon an initiating action but that there may be some small but reasonable delay, such as a propagation delay, between the reaction that is initiated by the initial action. Additionally, the term "while" means that a certain action occurs at least within some portion of a duration of the initiating action. The use of the word "approximately" or "substantially" means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and inactive means an inactive state of the signal. The actual voltage value or logic state (such as a "1" or a "0") of the signal depends on whether positive or negative logic is used. Thus, "asserted" can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms "first", "second", "third" and the like in the Claims or/and in the Detailed Description of the Drawings, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

The following description of embodiment(s) is merely illustrative in nature and is in no way intended to limit the invention, its application, or uses. The present application includes, among other things, an ESD device having: a semiconductor substrate of a first conductivity type; a first semiconductor region of the first conductivity type, wherein the first semiconductor region overlays substantially all of the semiconductor substrate; a first doped region of a second conductivity type, wherein the first doped region and the first semiconductor region together form a zener diode; a second semiconductor region of the second conductivity type disposed on a portion of the first semiconductor region and disposed on a portion of the first doped region, wherein a peak doping concentration of the second semiconductor region is less than a peak doping concentration of the semiconductor substrate; a second doped region of the first conductivity type disposed in the second semiconductor region and overlying the first doped region, wherein the second doped region is a least two microns apart from the first semiconductor region; a third doped region of the second conductivity type disposed in the second semiconductor region and overlying the first semiconductor region, wherein the third doped region is spaced at least two microns from the first semiconductor region; a fourth doped region of the first conductivity type disposed in the second semiconductor region and overlying the third doped region, wherein the third doped region, the fourth doped region, and the first semiconductor region together form a P-N-P junction; and a first isolation trench extending from a top surface of the second semiconductor region and into the first semiconductor region, wherein the first isolation trench surrounds an outside perimeter of the second doped region and at least a portion of the first doped region, and wherein the first isolation trench does not surround the third doped region or the fourth doped region.

The present application also includes, among other things, an ESD device having: an input terminal; an output terminal; a first channel connecting the input terminal and the output terminal, wherein the first channel comprises a diode and a zener diode connected in series, wherein an anode of the diode is connected to the input terminal, and wherein an anode of the zener diode is connected to the output terminal; and a second channel connecting the input terminal and the output terminal, wherein second channel comprises a P-N-P junction, wherein the first channel and the second channel connect the input terminal and the output terminal in parallel.

FIG. 1 includes a schematic diagram of a circuit for an ESD device. The device can have a high reverse bias (e.g., >10 V) and forward bias holding voltage (e.g., >2V). FIG. 1 includes a single channel ESD device 10. The ESD device 10 includes two terminals. Terminal 11 typically is an input terminal, and terminal 12 generally is an output terminal that is connected to another element (not shown) that is to be protected by ESD device 10. For example, terminal 11 may be connected to the high side of a regulated power supply (such as a 5V supply). ESD device 10 can be configured to have a low capacitance between the terminals 11 and 12. The ESD device 10 may be designed to limit the maximum voltage that is formed between terminals 11 and 12 to the clamp voltage of the ESD device 10. A sharp breakdown voltage characteristic (or sharp knee) of the ESD device 10 can assist in controlling more accurately the value of the clamp voltage. The low capacitance assists in providing the ESD device 10 with a fast response time. The ESD device 10 includes a steering diode 14 that is formed as P-N junction diode, zener diode 15 which is connected in series with diode 14, and P-N-P junction 18, which is coupled in parallel with the series combination of diodes 14 and 15. Channel 16 includes steering diode 14 and P-N-P junction 18.

In normal operation, ESD device 10 is biased to a normal operating voltage, such as a voltage that is between about 2 V and the breakdown voltage of diode 15, by applying about 2 V to terminal 11 and a ground reference voltage to terminal 12. Because of the characteristics of ESD device 10, the capacitance of the ESD device 10 can remain low as the voltage between the terminals 11 and 12 varies over this normal operating voltage. At a zero biased condition, ESD device 10 has very low capacitance values for diode 14. Since the capacitance of capacitors in series is the sum of the reciprocal values, the high capacitance of the Zener diode 15 can be neglected. The capacitance resulting from diodes 14 and 15 at the zero bias condition is approximately that of diode 14. The capacitance of the ESD device 10 is the sum of the capacitance of diode 14 plus the capacitance of P-N-P junction 18. The capacitance of P-N-P junction 18 is also very small, thus, the overall capacitance of ESD device 10 is very small at this zero bias condition.

If a positive ESD event is received on terminal 11, terminal 11 is forced to a large positive voltage relative to terminal 12. Because the anode of diode 14 is connected to terminal 11 and the cathode is connected to cathode of the diode 15, the large positive voltage forward biases diode 14 and reverse biases diode 15. As the voltage between terminals 11 and 12 reaches the positive threshold voltage of ESD device 10 (the forward voltage of diode 14 plus the breakdown voltage of diode 15) a positive current ($I_P$) flows from terminal 11 through diodes 14 and 15 to terminal 12. Diode 15 clamps the maximum voltage applied to terminal 12 to approximately the breakdown voltage of diode 15 (plus the forward voltage of diode 14). The sharp knee of diode 15 causes diode 15 to rapidly clamp the maximum voltage between terminals 11 and 12 to the breakdown voltage of diode 15. The breakdown voltage of diode 15 can be, for example, 2.5 V to 200 V, and in some embodiments, can be in a range of 20 V to 80 V. Meanwhile, P-N-P junction can be configured to have a breakdown voltage under a positive ESD event that is larger than the breakdown voltage of diode 15. This allows diodes 14 and 15 to safely handle the positive ESD pulse.

If a negative ESD event is received on terminal 11, terminal 11 is forced to a large negative voltage relative to terminal 12. P-N-P junction 18 can be configured, for example, to have a holding voltage of at least 2 V. P-N-P junction 18 may also be configured to have a breakdown voltage under a negative ESD event that is less than a breakdown voltage of diode 14. A negative current ($I_N$) therefore flows from terminal 12 through P-N-P junction 18, which can safely handle the negative ESD pulse, allowing ESD device 10 to provide bidirectional ESD protection at higher holding voltages.

Also depicted in FIG. 1 with dashed lines are additional components for multiple input embodiments of device 10. Several inputs (e.g., input terminals 82 and 83) can each be protected using the same combination of diodes and P-N-P junction in channels 80 and 81. The number of inputs can be, for example, one, two, three, four, five, ten, or more.

Figure 2:
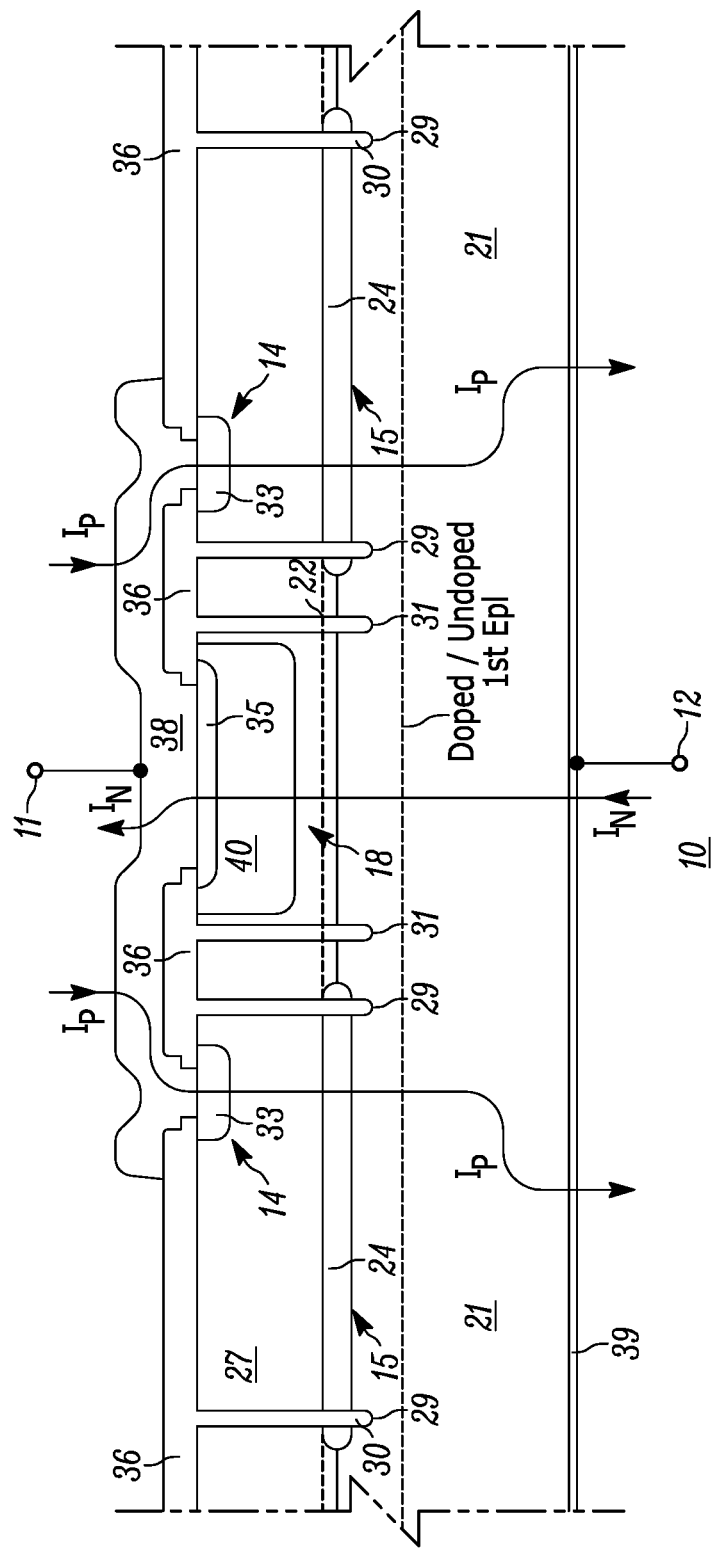
FIG. 2 illustrates a cross-sectional view of a portion of one example of ESD device in accordance with some embodiments of the present application.

FIG. 2 illustrates a cross-sectional view of a portion of one example of ESD device 10. Device 10 can optionally include semiconductor region 22 (shown as the region between the two horizontal dashed lines in FIG. 2) that overlays substrate 21. In some embodiments, semiconductor region 22 overlays substantially all of substrate 21. Semiconductor region 22 may be formed, for example, by epitaxial growth. In some embodiments, semiconductor region 22 has the same conductivity type (e.g., P-type) as semiconductor substrate 21. Semiconductor region 22 may optionally include a dopant gradient, where the dopant concentration decreases along its thickness moving away from semiconductor substrate 21, or the dopant concentration may increase along its thickness moving away from semiconductor substrate 21. In some embodiments, a portion of semiconductor region 22 is undoped. In some embodiments, a portion of semiconductor region 22 is doped higher or lower than the remaining portion of semiconductor region 22. The dopant concentration may be formed, for example, by applying a dopant gas during layer formation (e.g., epitaxial growth) and/or by diffusion of dopants between adjacent layers. In some embodiments, region 22 may be formed as an undoped epitaxial layer, where dopants from substrate 21 and layer 27 diffuse into region 22 to form a gradient. In some embodiments, region 22 may be formed from an implant of the same conductivity type as the substrate and a subsequent diffusion.

Semiconductor layer 27 is formed on substrate 21 and semiconductor region 22, such as by epitaxial growth. Diodes 14 each include doped regions 33 that are formed on the surface of layer 27 with the same conductivity as substrate 21. Region 33 is formed to extend into layer 27 and overlie regions 24. Regions 33 are generally positioned so that the periphery of regions 33 is at the surface of layer 27 and completely surrounded by trench 29.

Diode 15 is formed on semiconductor region 22. Semiconductor layer 27 is formed on substrate 21 and region 22, such as by epitaxial growth, and a portion of layer 27 may function as a drift region for diode 14. P-N-P junction 18 can be formed in layer 27 and region 22. ESD device 10 also includes conductors 38 and 39, and dielectric layer 36. Terminal 11 is typically the input and is electrically coupled to conductor 38, while terminal 12 is typically electrically coupled to ground and conductor 39.

Semiconductor region 24 is formed near the interface of the dopants that form layer 27 and the dopants of substrate 21 and region 22 in order to form diode 15. In some embodiments, substrate 21 is formed with a P-type conductivity having a doping concentration that is no less than approximately $1\times10^{19}$ atoms/cm$^3$ and preferably is between approximately $1\times10^{19}$ atoms/cm$^3$ and $1\times10^{21}$ atoms/cm$^3$. In some embodiments, region 22 has a constant doping concentration of between approximately $1\times10^{16}$ atoms/cm$^3$ and $1\times10^{20}$ atoms/cm$^3$. In some embodiments, semiconductor region 24 is formed as an N-type region having a doping concentration that is no less than approximately $1\times10^{19}$ atoms/cm$^3$ and preferably is between approximately $1\times10^{19}$ atoms/cm$^3$ and $1\times10^{21}$ atoms/cm$^3$. Additionally, the thickness of region 24 generally can be, for example, at least 1 micron, at least two microns, or between about one and three (1-3) microns, but may be other thicknesses. Because of the small thickness of region 24 in addition to the high doping concentration of region 24 and substrate 21, when device 10 receives a positive voltage from terminal 11 to terminal 12, the voltage causes the carrier concentration to be confined to a small and high density area within region 24 and near to the interface with substrate 21. This high concentration of carriers and dopants provides zener diode operating characteristics to the diode formed between region 22 and region 24 thereby forming zener diode 15. This combination also provides diode 15 with a very sharp transition or knee and allows very accurate control over the breakdown voltage or zener voltage of diode 15. The breakdown voltage or zener voltage of diode 15 can be adjusted by changing the carrier concentration of region 24, substrate 22, and/or substrate 21. The zener breakdown voltage can be substantially more controllable than a punch-through breakdown voltage.

Layer 27 preferably is formed to have a lower peak doping concentration that is at least one order of magnitude less than the doping concentration of region 24 and generally can be between about $1\times10^{13}$ atoms/cm$^3$ and $1\times10^{17}$ atoms/cm$^3$. Layer 27 and region 24 may be formed on substrate 21 by a variety of methods that are well known to those skilled in the art. For example, region 22 may be selectively doped to form region 24 and then layer 27 can be formed by epitaxial growth.

Isolation trenches 29 and 31 may be formed in order to isolate the portion where diode 14 is formed from the portion of layer 27 where junction 18 is formed. Trenches 29 and 31 generally are formed by a creating openings from a top surface of layer 27, through layer 27, and extending into substrate 21. Trench 29 also extends through region 24 a distance into region 22 in order to prevent conduction laterally through region 24 to layer 27 and junction 18. Methods to form trenches 29 and 31 are well known to those skilled in the art. Because trench 29 extends through region 24, it reduces alignment tolerances and makes it easier to reliably produce device 10. Trench 29 preferably forms a closed polygon with a periphery that has an opening which encloses a portion of layer 27. Trench 29 may be regarded as a multiply-connected domain. Similarly, trenches 31 may be regarded as a multiply-connected domain. Region 24 is positioned such that it extends between the outside edges of trench 29 but terminates before the outside edge of trench 31. This configuration assists in using region 24 to form a continuous zener diode 15 and to ensure region 24 does not extend into the portion of layer 27 underlying P-N-P junction 18. Trenches 29 and 31 can include dielectric liner 30 to improve electrical isolation.

Diode 14 includes a doped region 33 that is formed on the surface of layer 27 with the same conductivity as substrate 21. Region 33 is formed to extend into layer 27 and overlie region 24. Region 33 generally is positioned so that the periphery of region 33 that is at the surface of layer 27 is completely surrounded by trench 29. In some embodiments, trench 29 is one continuous trench that is formed around region 33. The peak doping concentration of region 33 generally is greater than the peak doping concentration of layer 27 and preferably is approximately equal to the peak doping concentration of substrate 21. Region 33 generally is formed to extend a distance no greater than about two (2) microns and preferably about one tenth to two (0.1-2) microns from the surface into layer 27. The large differential doping concentration between region 33 and layer 27 and the shallow depth of region 33 assists in providing diode 14 with a very small capacitance. This very small capacitance of diode 14 under zero bias conditions assists in forming a small zero bias capacitance for device 10 as indicated hereinbefore. The capacitance of diode 14 at zero bias generally is less than about 0.4 pico-farads and the equivalent series capacitance of diodes 14 and 15 forms a capacitance for device 10 that is generally is less than about 0.2 pico-farads and preferably is no greater than about 0.01 pico-farads.

Region 33 is separated from region 24 by a distance that assists in minimizing the capacitance of diode 14. The spacing generally is approximately less than one to twenty (<1-20) microns. The portion of layer 27 that is between regions 33 and 24 forms a drift portion of diode 14. The thickness of the drift region of layer 27 generally is at least around two microns in order to reduce the formation of parasitic transistors and to ensure that device 10 does not operate in a punch-through operating region.

Doped region 35 is formed at the surface of layer 27 and outside of trenches 29. The peak doping concentration of region 35 generally is greater than the peak doping concentration of layer 27 and preferably is approximately equal to the peak doping concentration of substrate 21. In some embodiments, region 35 and region 33 have approximately the same peak doping concentration. Doped region 35 overlays deep N implant region 40 formed in layer 27. Region 40 may, for example, have a peak doping concentration of at least approximately $1\times10^{18}$ atoms/cm$^3$, or at least approximately $1\times10^{19}$ atoms/cm$^3$. In some embodiments, the peak doping concentration of region 40 is less than the doping concentration of region 35. Region 40 may, in some embodiments, be spaced at least 1 micron, at least two microns, or between about one to about three (1-3) microns away from region 22.

Doped region 35, N-implant region 40, and region 22 can together form P-N-P junction 18 of device 10. The skilled artisan, guided by the teachings of the present application, will appreciate that the relative doping concentrations for these components can be modified to obtain a desired forward bias holding voltage for device 10. For example, the forward bias holding voltage may be at least about 2 V, or at least about 3 V. In some embodiments, the collector-emitter voltage for the P-N-P junction may be at least about 1 V, at least about 2 V, at least about 5 V, at least about 10 V, or at least about 15 V. In some embodiments, the collector-emitter voltage for the P-N-P junction may be no more than about 30 V, no more than about 25 V, no more than about 20 V, or no more than about 15V. As an example, the collector-emitter voltage for the P-N-P junction may be between about 1 V to at about 30 V. In some embodiments, the P-N-P junction is a vertical P-N-P junction.

Trench 31 surrounds doped region 35 and N-implant region 40 to isolate junction 18 from diode 15. Trench 31 can be, for example, a closed polygon that completely surrounds doped region 35 and N-implant region 40. Trench 31 extends into region 22 and may, in some embodiments, have about the same depth as trench 29. Trench 31 may also be formed from the same materials as trench 29.

The skilled artisan, guided by the teachings of the present application, can readily adapt the ESD device to include additional channels. For example ESD device 10 as depicted in FIG. 2 may be adapted to include optional channels 80 and 81 as depicted in FIG. 1. The additional channels may be formed, for example, by duplicating the components formed on substrate 21 in a different region of substrate 21, where isolation trenches are appropriately configured to isolate the separate channels.

Figure 3:
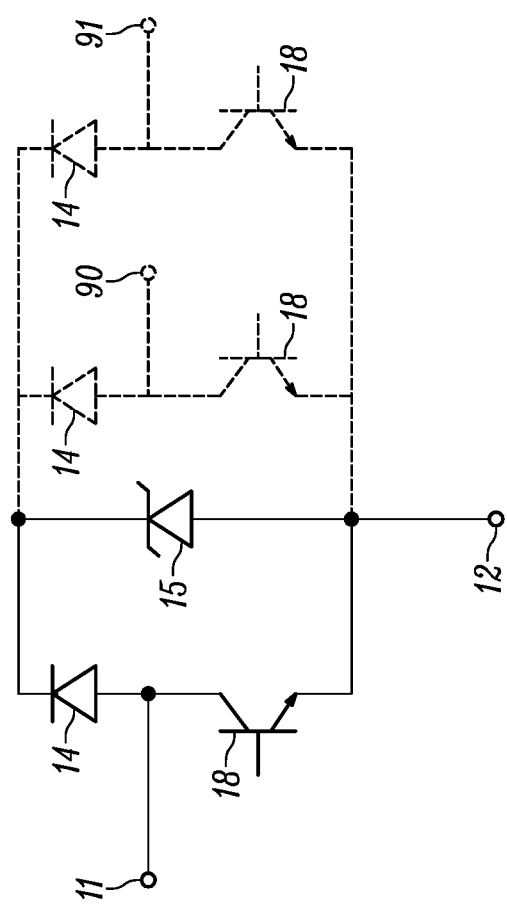
FIG. 3 includes a schematic diagram of a circuit for an ESD device in accordance with some embodiments of the present application.

FIG. 3 includes a schematic diagram of a circuit for another embodiment of an ESD device. The device can include multiple IO (as shown with dashed lines). Each terminal (e.g., terminals 11, 90, and 91) is connected in parallel via separate diodes 14 to shared zener diode 15. Each of diodes 14 have the cathode connected to the cathode of shared zener diode 15. The ESD device depicted in FIG. 3 depicts having one and optionally up to three input terminals, however the number of terminals is not particularly limited. The number of terminals can be, for example, one, two, three, four, five, ten, or more.

The skilled artisan, guided by the teachings of the present application, can readily modify ESD device 10 as depicted in FIG. 2 to obtain the ESD device depicted in FIG. 3. For example, a second conductor may be formed over the device similar to conductor 39 to provide a second input terminal. A portion of the conductor may overlie the portion of semiconductor region 27 contained within isolation trenches 29. A second doped region having, for example, with the same or similar features to region 33 is formed in region 27 but connects to the second conductor. The second conductor may also be coupled to a separate P-N-P junction having, for example, the same or similar properties as junction 18 and optionally contained within a separate isolation trench that is the same or similar to trench 31.

The ESD device depicted in FIG. 3 differs from the ESD device depicted in FIG. 1 in that multiple inputs share one or more zener diodes. The skilled artisan, guided by the teachings of the present application, will appreciate that an ESD device may combine features from those depicted in FIGS. 1 and 3. That is, the ESD device may include a combination of shared and unshared zener diodes. For example, an ESD device may have four inputs terminals, where two inputs share one or more zener diodes, while the other two inputs share one or more different zener diodes. As another example, an ESD device may have three input terminals, where one input has one or more dedicated zener diodes, while the two other inputs share one or more zener diodes. In some embodiments, the number of zener diodes is less than or equal to a number of input terminals. In some embodiments, the number of zener diodes is greater than or equal to a number of input terminals.

The skilled artisan may similarly apply the teachings in the present application to modify ESD device 10 to include a combination shared and unshared zener diodes. In this case, certain terminals will have a second conductor overlying a portion of semiconductor region 27 contained within isolation trenches 29. A second doped region having, for example, the same or similar features to region 33 is formed in region 27, but connects to the second conductor. Meanwhile, a third conductor may be placed over a separate region of substrate 21, coupled to separate a zener diode, and isolated using appropriately configured isolation trenches.

ESD devices disclosed in the present application may, in some embodiments, have a breakdown voltage of at least about 1 V, at least about 20 V, at least about 30 V, or at least about 40 V. ESD devices disclosed in the present application may, in some embodiments, have a breakdown voltage of no more than about 80 V, no more than about 70 V, no more than about 60 V, nor more than about 50 V, or no more than about 40 V. For example, ESD devices disclosed in the present application may have a breakdown voltage of 27 V, 44 V, or 60 V.

ESD devices disclosed in the present application may, in some embodiments, have a capacitance of no more than about 20 picofarad, no more than about 10 picofarad, no more than about 5 picofarad, or no more than about 1 picofarad. ESD devices disclosed in the present application may, in some embodiments, have a negative ground shift of at least about 1 V, at least about 2 V, at least about 3 V, or at least about 5 V.

Some embodiments disclosed herein include a method of providing electrostatic discharge protection to one or more electrical devices, such as a semiconductor die. The method may include electrically coupling an input terminal from any of the ESD devices disclosed in the present application (e.g., terminal 11 in ESD 10) to the electrical device. The method may also including coupling a second terminal from any of the ESD devices disclosed in the present application (e.g., terminal 12 in ESD 10) to ground.

From all the foregoing one skilled in the art can determine that according to one embodiment, an ESD device includes: a semiconductor substrate of a first conductivity type; a first semiconductor region of the first conductivity type, where the first semiconductor region overlays substantially all of the semiconductor substrate; a first doped region of a second conductivity type, wherein the first doped region and the first semiconductor region together form a zener diode; a second semiconductor region of the second conductivity type disposed on a portion of the first semiconductor region and disposed on a portion of the first doped region, wherein a peak doping concentration of the second semiconductor region is less than a peak doping concentration of the semiconductor substrate; a second doped region of the first conductivity type disposed in the second semiconductor region and overlying the first doped region, wherein the second doped region is a least two microns apart from the first semiconductor region; a third doped region of the second conductivity type disposed in the second semiconductor region and overlying the first semiconductor region, wherein the third doped region is spaced at least two microns from the first semiconductor region; a fourth doped region of the first conductivity type disposed in the second semiconductor region and overlying the third doped region, wherein the third doped region, the fourth doped region, and the first semiconductor region together form a P-N-P junction; and a first isolation trench extending from a top surface of the second semiconductor region and into the first semiconductor region, wherein the first isolation trench surrounds an outside perimeter of the second doped region and at least a portion of the first doped region, and wherein the first isolation trench does not surround the third doped region or the fourth doped region.

From all the foregoing one skilled in the art can determine that according to one embodiment, an ESD device includes: a semiconductor substrate of a first conductivity type and having a doping concentration of at least about $1\times10^{19}$ atoms/cm$^3$; a first semiconductor region of the first conductivity having a constant doping concentration of about $1\times10^{16}$ atoms/cm$^3$ to about $1\times10^{20}$ atoms/cm$^3$, wherein the first semiconductor region overlays substantially all of the semiconductor substrate; a first doped region of a second conductivity type having a doping concentration of at least about $1\times10^{19}$ atoms/cm$^3$, wherein the first doped region and the first semiconductor region together form a zener diode; a second semiconductor region of the second conductivity type disposed on a portion of the first semiconductor region and a portion of the first doped region, wherein the second semiconductor region has a peak doping concentration that is less than the first peak doping concentration; a second doped region of the first conductivity type disposed in the second semiconductor region and overlying the first doped region, wherein the second doped region is a least two microns apart from the first semiconductor region, wherein the second doped region has a peak doping concentration of at least about $1\times10^{19}$ atoms/cm$^3$; a third doped region of the second conductivity type disposed in the second semiconductor region and overlying the first semiconductor region, wherein the third doped region is spaced at two microns from the first semiconductor region, and wherein the third doped region has a peak doping concentration of at least about $1\times10^{19}$ atoms/cm$^3$; a fourth doped region of the first conductivity type disposed in the second semiconductor region and overlying the third doped region, wherein the fourth doped region has a peak doping concentration of at least about $1\times10^{19}$ atoms/cm$^3$; and a first isolation trench extending from a top surface of the second semiconductor region and into the first semiconductor region, wherein the first isolation trench surrounds an outside perimeter of the second doped region and a portion of the first doped region, and wherein the first isolation trench does not surround the third doped region or the fourth doped region.

From all the foregoing one skilled in the art can determine that according to one embodiment, an ESD device includes: an input terminal; an output terminal; a first channel connecting the input terminal and the output terminal, wherein the first channel comprises a diode and a zener diode connected in series, wherein an anode of the diode is connected to the input terminal, and wherein an anode of the zener diode is connected to the output terminal; and a second channel connecting the input terminal and the output terminal, wherein second channel comprises a P-N-P junction, wherein the first channel and the second channel connect the input terminal and the output terminal in parallel.

In some embodiments, the ESD device provide bidirectional ESD protection. In some embodiment, ESD comprises multiple inputs connected in parallel to an output terminal.

As the claims hereinafter reflect, inventive aspects may lie in less than all features of a single foregoing disclosed embodiment. Thus, the hereinafter expressed claims are hereby expressly incorporated into this Detailed Description of a non-limiting sample of embodiments, with each claim standing on its own as a separate embodiment of an invention. Furthermore, while some embodiments described herein include some but not other features included in other embodiments, combinations of features of different embodiments are meant to be within the scope of the disclosure, and form different embodiments, as would be understood by those skilled in the art. Such variations are not to be regarded as a departure from the spirit and scope of the present disclosure.

In view of the above, it is evident that a novel device and method is disclosed that can, in at least one embodiment, include a P-N-P junction connecting an input terminal and output terminal.

While the subject matter of the invention is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art.

What is claimed is:

1. An ESD device comprising:
    a semiconductor substrate of a first conductivity type;
    a first semiconductor region of the first conductivity type, wherein the first semiconductor region overlays substantially all of the semiconductor substrate;
    a first doped region of a second conductivity type, wherein the first doped region and the first semiconductor region together form a zener diode;
    a second semiconductor region of the second conductivity type disposed on a portion of the first semiconductor region and disposed on a portion of the first doped region, wherein a peak doping concentration of the second semiconductor region is less than a peak doping concentration of the semiconductor substrate;
    a second doped region of the first conductivity type disposed in the second semiconductor region and overlying the first doped region, wherein the second doped region is a least two microns apart from the first semiconductor region;
    a third doped region of the second conductivity type disposed in the second semiconductor region and overlying the first semiconductor region, wherein the third doped region is spaced at least two microns from the first semiconductor region;
    a fourth doped region of the first conductivity type disposed in the second semiconductor region and overlying the third doped region, wherein the third doped region, the fourth doped region, and the first semiconductor region together form a P-N-P junction; and
    a first isolation trench extending from a top surface of the second semiconductor region and into the first semiconductor region, wherein the first isolation trench surrounds an outside perimeter of the second doped region and at least a portion of the first doped region, and wherein the first isolation trench does not surround the third doped region or the fourth doped region.

2. The ESD device of claim 1, wherein the first conductivity type is a P-type conductivity and the second conductivity type is a N-type conductivity.

3. The ESD device of claim 1, wherein the P-N-P junction has a collector-emitter voltage of about 1 V to about 30 V.

4. The ESD device of claim 1, wherein the second doped region and the second semiconductor region together form a diode, and wherein a breakdown voltage of the diode is greater than a breakdown voltage for the P-N-P junction.

5. The ESD device of claim 1, wherein the peak doping concentration of the semiconductor substrate is at least about $1 \times 10^{19}$ atoms/cm$^3$.

6. The ESD device of claim 1, wherein a constant doping concentration of the first semiconductor region is about $1 \times 10^{16}$ atoms/cm$^3$ to about $1 \times 10^{20}$ atoms/cm$^3$.

7. The ESD device of claim 1, wherein a peak doping concentration of the second doped region is at least about $1 \times 10^{19}$ atoms/cm$^3$.

8. The ESD device of claim 1, wherein a peak doping concentration of the third doped region is at least about $1 \times 10^{19}$ atoms/cm$^3$.

9. The ESD device of claim 1, wherein a peak doping concentration of the fourth doped region is at least about $1 \times 10^{19}$ atoms/cm$^3$.

10. The device of claim 1, further comprising a conductor applied to the second doped region and the fourth doped region.

11. The device of claim 1, further comprising a conductor applied to the bottom surface of the semiconductor substrate.

12. An ESD device comprising:
a semiconductor substrate of a first conductivity type and having a doping concentration of at least about $1 \times 10^{19}$ atoms/cm$^3$;
a first semiconductor region of the first conductivity having a constant doping concentration of about $1 \times 10^{16}$ atoms/cm$^3$ to about $1 \times 10^{20}$ atoms/cm$^3$, wherein the first semiconductor region overlays substantially all of the semiconductor substrate;
a first doped region of a second conductivity type having a doping concentration of at least about $1 \times 10^{19}$ atoms/cm$^3$, wherein the first doped region and the first semiconductor region together form a zener diode;
a second semiconductor region of the second conductivity type disposed on a portion of the first semiconductor region and a portion of the first doped region, wherein the second semiconductor region has a peak doping concentration that is less than peak doping concentration of the semiconductor substrate;
a second doped region of the first conductivity type disposed in the second semiconductor region and overlying the first doped region, wherein the second doped region is a least two microns apart from the semiconductor region, wherein the second doped region has a peak doping concentration of at least about $1 \times 10^{19}$ atoms/cm$^3$;
a third doped region of the second conductivity type disposed in the second semiconductor region and overlying the first semiconductor region, wherein the third doped region is spaced at two microns from the first semiconductor region, and wherein the third doped region has a peak doping concentration of at least about $1 \times 10^{19}$ atoms/cm$^3$;
a fourth doped region of the first conductivity type disposed in the second semiconductor region and overlying the third doped region, wherein the fourth doped region has a peak doping concentration of at least about $1 \times 10^{19}$ atoms/cm$^3$; and
a first isolation trench extending from a top surface of the second semiconductor region and into the first semiconductor region, wherein the first isolation trench surrounds an outside perimeter of the second doped region and a portion of the first doped region, and wherein the first isolation trench does not surround the third doped region or the fourth doped region.

13. The device of claim 1, wherein the first conductivity type is a P-type conductivity, and the second conductivity type is a N-type conductivity.

14. The device of claim 1, wherein the first doped region has about the same doping concentration as the second doped region.

15. The device of claim 1, wherein a doping concentration of the third doped region is less than a doping concentration of the fourth doped region.

16. The device of claim 1, wherein the semiconductor substrate, the third doped region, and the fourth doped region together form a P-N-P junction in parallel with the zener diode.

17. The device of claim 16, wherein the P-N-P junction has a collector-emitter voltage of at about 1 V to about 30 V.

18. The device of claim 1, further comprising a conductor applied to the second doped region and the fourth doped region.

19. The device of claim 1, further comprising a conductor applied to the bottom surface of the semiconductor substrate.

* * * * *